US 6,590,924 B2

(12) United States Patent
Fish et al.

(10) Patent No.: US 6,590,924 B2
(45) Date of Patent: Jul. 8, 2003

(54) MIRROR AND CAVITY DESIGNS FOR SAMPLED GRATING DISTRIBUTED BRAGG REFLECTOR LASERS

(75) Inventors: Gregory A. Fish, Santa Barbara, CA (US); Larry A. Coldren, Santa Barbara, CA (US)

(73) Assignee: Agility Communications, Inc., Goleta, CA (US)

( * ) Notice: Subject to any disclaimer, the term of this patent is extended or adjusted under 35 U.S.C. 154(b) by 0 days.

(21) Appl. No.: 09/848,791

(22) Filed: May 4, 2001

(65) Prior Publication Data

US 2002/0105990 A1 Aug. 8, 2002

Related U.S. Application Data
(60) Provisional application No. 60/203,052, filed on May 4, 2000.

(51) Int. Cl.⁷ .................................................. H01S 3/08
(52) U.S. Cl. ............................ 372/96; 372/20; 372/50; 372/108; 356/301; 385/37; 438/34
(58) Field of Search ........................ 372/96, 20, 50, 372/108; 356/301; 385/37; 438/34

(56) References Cited

U.S. PATENT DOCUMENTS

| | | | |
|---|---|---|---|
| 4,622,672 A | | 11/1986 | Coldren et al. |
| 4,896,325 A | * | 1/1990 | Coldren ..................... 372/20 |
| 5,088,097 A | | 2/1992 | Ono et al. |
| 5,155,736 A | * | 10/1992 | Ono et al. .................. 372/20 |
| 5,325,392 A | * | 6/1994 | Tohmori et al. ............ 372/96 |
| 5,379,318 A | * | 1/1995 | Weber ........................ 372/96 |
| 5,392,311 A | * | 2/1995 | Makuta ...................... 372/96 |
| 5,579,328 A | | 11/1996 | Habel et al. |
| 5,715,271 A | | 2/1998 | Huang et al. |
| 5,790,581 A | | 8/1998 | Nitta |
| 5,841,799 A | | 11/1998 | Hiroki |
| 6,100,975 A | * | 8/2000 | Smith et al. ............... 356/301 |
| 6,345,135 B1 | * | 2/2002 | Reid et al. .................. 385/37 |
| 6,349,106 B1 | * | 2/2002 | Coldren ...................... 372/50 |
| 6,421,365 B1 | * | 7/2002 | Kleinschmidt et al. ..... 372/108 |
| 6,432,736 B1 | * | 8/2002 | Lee et al. ................... 438/34 |

FOREIGN PATENT DOCUMENTS

WO    WO 99/40654    8/1999

OTHER PUBLICATIONS

IEEE Journal of Quantum Electronics, vol. 34, No. 4, Apr. 1998, "Design of widely tunable semiconductor lasers and concept of binary superimposed grating".*

I.A. Avrutsky et al., "Design of Widely Tunable Semiconductor Lasers and the Concept of Binary Superimposed Gratings (BSG's)," IEEE Journal of Quantum Elec., Apr. 1998, 34(4): 729–741.

L.A. Coldren et al., "Photonic Integrated Circuits," Diode Lasers and Phototonic Integrated Circuits, John Wiley & Sons, 1995, ch. 8: 342–391.

(List continued on next page.)

*Primary Examiner*—Paul Ip
*Assistant Examiner*—Tuan Nguyen
(74) *Attorney, Agent, or Firm*—Gates & Cooper LLP

(57) ABSTRACT

A tunable laser comprised of a gain section for creating a light beam by spontaneous emission over a bandwidth, a phase section for controlling the light beam around a center frequency of the bandwidth, a cavity for guiding and reflecting the light beam, a front mirror bounding an end of the cavity, and a back mirror bounding an opposite end of the cavity. The back mirror has a $\kappa_{effB}$ approximately equal to $\alpha_{Tune}$, where $\kappa_{effB}$ is an effective coupling constant and $\alpha_{Tune}$ is the maximum amount of propagation loss anticipated for an amount of peak tuning required, and a length of the back mirror is made to produce greater than approximately 80% reflectivity.

33 Claims, 11 Drawing Sheets

OTHER PUBLICATIONS

L.A. Coldren et al., "Properties of Widely–Tunable Integrated WDM Sources and Receivers," 1997 Annual Meeting (LEOS), San Francisco, CA, USA, Nov. 1997, Paper No. TuY1, 331–332 [62–63].

L.A. Coldren et al., "Tunable Lasers for Photonic Integrated Circuits," IEEE Summer Topical on Integrated Optoelectronics, Lake Tahoe, NV, USA, Jul. 1994, Paper No. W4.1, 88–89.

L.A. Coldren, "Widely–Tunable and Vertical–Cavity Lasers: DBR's on Different Planes," Integrated Photonics Research, San Francisco, CA, USA, Feb. 1994, Paper No. ThA3–1, 75–76.

G. Fish et al., "Compact, 4×4 InGaAsP–InP Optical Crossconnect with a Scaleable Architecture," IEEE Photonics Tech. Lett., Sep. 1998, 10(9): 42–44.

G. Fish et al., "Improved Compositional Uniformity of InGaAsP Grown by MOCVD Through Modification of the Susceptor Temperature Profile," Journal of Crystal Growth, 1997, 32–38.

G. Fish et al., "InGaAsP/InP Scaleable, Photonic Crossconnects Using Optically Amplified Suppressed Modal Interference Switch Arrays," Integrated Photonics Research '98, Victoria, Canada, Mar. 1998, Paper No. ITuE4, 243–245 [39–41].

G. Fish et al., "InGaAsP/InP Suppressed Model Interference Switches with Integrated Curved Amplifiers for Scaleable Photonic Crossconnects," Optical Fiber Conference '98, San Jose, CA, USA, Feb. 1998, Paper No. TuH4, 1pp.

G. Fish et al., "Suppressed Model Interference Switches with Integrated Curved Amplifiers for Scaleable Photonic Crossconnects," IEEE Photonics Tech. Lett., Feb. 1998, 10(2)28–30.

M.E. Heimbuch et al., "Tertiarybutylarsine and Tertiarybutylphosphine for the MOCVD Growth of Low Threshold 1.55 $\mu$m $In_xGa_{1-x}As/InP$ Quantum–Well Lasers," Journal of Elec. Materials, 1994, 23(2): 77–81.

H. Ishii et al., "Broad–range Wavelength Coverage (62.4nm) with Superstructure–Grating DBR Laser," Elec. Lett., Feb. 29, 1996, 32(5): 454–455.

H. Ishii et al., "Quasicontinuous Wavelength Tuning in Super–Structure–Grating (SSG) DBR Lasers," IEEE Journal of Quantum Elec., Mar. 1996, 32(3): 433–441.

Y–H. Jan et al., "Widely Tunable Integrated Filter/Receiver with Apodized Grating–Assisted Codirectional Coupler (INVITED)," SPIE Photonics West '98, San Jose, CA, USA, Jan. 1998, Paper No. 3290–232: 24–27.

V. Jayaraman et al., "Continuous–Wave Operation of Sampled Grating Tunable Lasers with 10 mwatt Output Power, >60 nm Tuning, and Monotonic Tuning Characteristics," Indium Phosphide Conference, Santa Barbara, CA, USA, Mar. 1994, 33–36 [82–85].

V. Jayaraman et al., "Demonstration of Broadband Tunability in a Semiconductor Laser Using Sampled Gratings," Appl. Phys. Lett., May 1992, 60(19): 110–112.

V. Jayaraman et al., "Extended Tuning Range in Sampled Grating DBR Lasers," IEEE Photonics Tech. Lett., May 1993, 5(5): 103–105.

V. Jayaraman et al., "Extended Tuning Range Semiconductor Lasers with Sampled Gratings," LEOS '91, San Jose, CA, USA, Nov. 1991, Paper No. SDL15.5: 82 [113].

V. Jayaraman et al., "Theory, Design, and Performance of Extended Tuning Range Semiconductor Lasers with Sampled Gratings," IEEE Journal of Quantum Elec., Jun. 1993, 29(6): 92–102.

V. Jayaraman et al., "Very Wide Tuning Range in a Sampled Grating DBR Laser," Int. Semiconductor Laser Conference, Takamatsu, Japan, Sep. 1992, 108–109.

V. Jayaraman, et al., "Wide Tunability and Large–Mode–Suppression in a Multi–Section Semiconductor Laser Using Sampled Gratings," Integrated Photonics Research '92, New Orleans, LA, USA, Apr. 1992, Paper No. WF1, 306–307 [106–107].

V. Jayaraman et al., "Widely Tunable Continuous–Wave InGaAsP/InP Sampled Grating Lasers," Elec. Lett., Sep. 1994, 30(18): 90–91.

S–L. Lee et al., "Direct Modulation of Widely Tunable Sampled Grating DBR Lasers," SPIE, 1996, 2690(223): 223–230 [64–71].

S–L. Lee et al., "Dynamic Responses of Widely Tunable Sampled Grating DBR Lasers," Photonics Tech. Lett., Dec. 1996, 8(12): 72–74.

S–L. Lee et al., "Field–Induced Guide/Antiguide Modulators on InGaAsP/InP," Elec. Lett., Jun. 9, 1994, 30(12): 954–955 [86–87].

S–L. Lee et al., "Integration of Semiconductor Laser Amplifiers with Sampled Grating Tunable Lasers for WDM Applications," IEEE Journal of Selected Topics in Quantum Elec., Apr. 1997, 3(2): 49–61.

B. Mason et al., "Design of Sampled Grating DBR Lasers with Integrated Semiconductor Optical Amplifiers," IEEE Photonics Tech. Lett., Jul. 2000, 12(7): 1–3.

B. Mason et al., "Directly Modulated Sampled Grating DBR Lasers for Long–Haul WDM Communication Systems," IEEE Photonics Tech. Lett., 9(3): 46–48.

B. Mason et al., "Monolithic Integration of a Widely Tunable Laser and an Electro–Absorption Modulator," Integrated Photonics Research '99, San Barbara, CA, USA, Jul. 1999, Paper No. RME2, 53–55 [7–9].

B. Mason et al., "Ridge Waveguide Sampled Grating DBR Lasers with 22–nm Quasi–Continuous Tuning Range," IEEE Photonics Technology Letters, Sep. 1998, 10(9): 19–21.

B. Mason et al., "Sampled Grating DBR Lasers with 22nm Quasi–Continuous Tuning and Monolithically Integrated Wavelength Monitors," Int'l. Semiconductor Laser Conf. '98, Nara, Japan, Oct. 1998, Paper No. ThC4, 22–23.

B. Mason et al., "Sampled Grating DBR Lasers with Integrated Wavelength Monitoring," Integrated Photonics Rsearch '98, Victoria, Canada, Mar. 1998, Paper No. IMD5, 52–54 [13–15].

B. Mason et al., "Tunable Sampled–Grating DBR Lasers with Integrated Wavelength Monitors," IEEE Photonics Tech. Lett., Aug. 1998, 10(8): 16–18.

B. Mason et al., "Widely Tunable Lasers for Wavelength–Division Multiplexed Communications," Optical Fiber Communication '97, Dallas, TX, USA, Feb. 1997, 45.

B. Mason et al., "Widely Tunable Sampled Grating DBR Laser with Integrated Electroabsorption Modulator," IEEE Photonics Tech. Lett., Jun. 1999, 11(6): 4–6.

D.M. Tennant et al., "Multiwavelength Distributed Bragg Reflector Laser . . . Grating Mask," J. Vac. Sci. Technol. B, Nov./Dec. 1993, 11(6): 2509–2513.

Robbins et al., "Design and Optimisation of Sampled Grating DBR Lasers for Dense WDM Networks," ECOC '98, Madrid Spain, pp. 221–222.

Robbins et al., "Sampled Grating DBR Lasers for WDM Systems," IEE, 1998, pp. 9/1–9/4.

Wood et al., "Time Domain Modelling of Sampled Grating Tunable Lasers," IEE, 2000, 147(1): 43–48.

H. Ishii et al., "Mode Stabilization Method for Superstructure–Grating DBR Lasers," Jnl. of Lightwave Technology, 1998, 16(3): 433–442.

G. Sarlet et al., "Wavelength and Mode Stabilization of Widely Tunable SG–DBR and SSG–DBR Lasers," IEEE Photonics Tech. Lett., 1999, 11(11): 1351–1353.

* cited by examiner

| Parameter | $\delta\lambda$ 0.4 nm | $\delta\lambda$ 0.5 nm | $\delta\lambda$ 0.5 nm | $\delta\lambda$ 0.6 nm | $\delta\lambda$ 0.7 nm |
|---|---|---|---|---|---|
| $P_o$ | 6 mW | 6 mW | 6 mW | 6 mW | 6 mW |
| SMSR @ 1mW | 33 dB | 33 dB | 30 dB | 33 dB | 33 dB |
| Injection Efficiency | 0.75 | 0.75 | 0.75 | 0.75 | 0.75 |
| Tuning Range | 50 nm | 50 nm | 50 nm | 50 nm | 50 nm |
| Peak Tuning Required ($\Delta\lambda_f + \delta\lambda/2$) | 4.8 nm | 5.5 nm | 5.5 nm | 5.9 nm | 6.5 nm |
| Current for $P_o$ max | 103 mA | 103 mA | 81 mA | 93 mA | 79 mA |
| Current for $P_o$ min | 47 mA | 46 mA | 43 mA | 45 mA | 44 mA |
| Gain Section Length | 550 μm | 550 μm | 500 μm | 550 μm | 550 μm |
| Threshold current density min | 1.4 kA/cm$^2$ | 1.3 kA/cm$^2$ | 1.3 kA/cm$^2$ | 1.3 kA/cm$^2$ | 1.3 kA/cm$^2$ |
| Threshold current density max | 2.6 kA/cm$^2$ | 2.6 kA/cm$^2$ | 2.5 kA/cm$^2$ | 2.4 kA/cm$^2$ | 2.3 kA/cm$^2$ |
| Grating κ | 350 cm$^{-1}$ | 350 cm$^{-1}$ | 350 cm$^{-1}$ | 350 cm$^{-1}$ | 350 cm$^{-1}$ |
| Front Mirror R (lossless) | 0.216 | 0.232 | 0.258 | 0.245 | 0.206 |
| Front Mirror κ (cm$^{-1}$) | 12 cm$^{-1}$ | 14.4 cm$^{-1}$ | 23.1 cm$^{-1}$ | 19.2 cm$^{-1}$ | 24.0 cm$^{-1}$ |
| Front Mirror Period | 68.7 μm | 60.6 μm | 60.6 μm | 56.4 μm | 51.0 μm |
| Front Mirror Burst | 2.4 μm | 2.5 μm | 4 μm | 3.1 μm | 3.5 μm |
| Front Mirror Burst Number | 6 | 6 | 4 | 5 | 4 |
| Front Mirror Length (μm) | 346 μm | 305 μm | 185 μm | 229 μm | 156 μm |
| Back Mirror Reflectivity | 0.812 | 0.84 | 0.85 | 0.85 | 0.85 |
| Back Mirror κ | 26.5 cm$^{-1}$ | 31.3 cm$^{-1}$ | 32.4 cm$^{-1}$ | 33.2 cm$^{-1}$ | 36.5 cm$^{-1}$ |
| Back Mirror Period | 75.3 μm | 67.0 μm | 67.0 μm | 63.2 μm | 57.5 μm |
| Back Mirror Burst | 5.7 μm | 6 μm | 6.2 μm | 6 μm | 6 μm |
| Back Mirror Burst Number | 13 | 13 | 13 | 13 | 12 |
| Back Mirror Length | 909 μm | 810 μm | 810 μm | 764 μm | 638 μm |

FIG. 11

MIRROR AND CAVITY DESIGNS FOR SAMPLED GRATING DISTRIBUTED BRAGG REFLECTOR LASERS

CROSS-REFERENCE TO RELATED APPLICATIONS

This application claims the benefit under 35 U.S.C. Section 119(e) of the following commonly-assigned U.S. provisional patent application Ser. No. 60/203,052, filed May 4, 2000, by Gregory A. Fish and Larry A. Coldren, entitled "IMPROVED MIRROR AND CAVITY DESIGNS FOR SGDBR LASERS," which application is incorporated by reference herein.

BACKGROUND OF THE INVENTION

1. Field of the Invention

The present invention relates generally to wide-range tunable semiconductor lasers and particularly to sampled-grating distributed Bragg reflector (SGDBR) lasers.

2. Description of the Related Art

Diode lasers are being used in such applications as optical communications, sensors and computer systems. In such applications, it is very useful to employ lasers that can be easily adjusted to output frequencies across a wide wavelength range. A diode laser which can be operated at selectably variable frequencies covering a wide wavelength range is an invaluable tool. The number of separate channels that can utilize a given wavelength range is exceedingly limited without such a laser. Accordingly, the number of individual communications paths that can exist simultaneously in a system employing such range-limited lasers is similarly very limited. Thus, while diode lasers have provided solutions to many problems in communications, sensors, and computer system designs, they have not fulfilled their potential based on the available bandwidth afforded by light-based systems. It is important that the number of channels be increased in order for optical systems to be realized for many future applications.

For a variety of applications, it is necessary to have tunable single-frequency diode lasers which can select any of a wide range of wavelengths. Such applications include sources and local oscillators in coherent lightwave communications systems, sources for other multi-channel lightwave communication systems, and sources for use in frequency modulated sensor systems. Continuous tunability is usually needed over some range of wavelengths. Continuous tuning is important for wavelength locking or stabilization with respect to some other reference, and it is desirable in certain frequency shift keying modulation schemes.

Sampled-grating distributed Bragg reflector (SGDBR) lasers obtain many of these desirable features through the use of two sampled gratings bounding a gain and phase section of a semiconductor. The basic function and structure of SGDBR lasers is detailed in U.S. Pat. No. 4,896,325, issued Jan. 23, 1990, to Larry A. Coldren, entitled "MULTI-SECTION TUNABLE LASER WITH DIFFERING MULTI-ELEMENT MIRRORS", which patent is incorporated by reference herein. However, designing an optimized SGDBR laser for a given application can be a complex, time consuming, iterative process. There is a need in the art for methods and devices that facilitate simpler, more manufacturable designing of SGDBR lasers based on application-specific performance criteria.

SUMMARY OF THE INVENTION

To address the issues described above, the present invention discloses a tunable laser comprised of a gain section for creating a light beam by spontaneous and stimulated emission over a bandwidth, a phase section for controlling the light beam around a center frequency of the bandwidth, a cavity for guiding and reflecting the light beam, a front mirror bounding an end of the cavity, and a back mirror bounding an opposite end of the cavity. The back mirror has a $\kappa_{\mathit{effB}}$ approximately equal to $\alpha_{\mathit{Tune}}$, where $\kappa_{\mathit{effB}}$ is an effective coupling constant and $\alpha_{\mathit{Tune}}$ is an amount of propagation loss anticipated for an amount of peak tuning required, and a length of the back mirror is made to produce greater than approximately 70% reflectivity (at a minumum, to approximately 80% reflectivity at a maximum) in combination with a front mirror that is intended to produce less than approximately 25% reflectivity.

BRIEF DESCRIPTION OF THE DRAWINGS

Referring now to the drawings in which like reference numbers represent corresponding parts throughout:

FIG. 11 is a table of calculated examples;

DETAILED DESCRIPTION OF THE PREFERRED EMBODIMENTS

In the following description, reference is made to the accompanying drawings which form a part hereof, and which is shown, by way of illustration, an embodiment of the present invention. It is understood that other embodiments may be utilized and structural changes may be made without departing from the scope of the present invention.

The present invention relates to the design of widely tunable sampled-grating semiconductor lasers. More specifically, it focuses on designing the cavity and grating mirrors to achieve wider tuning range, higher output power, easier control, with less output power variations between best and worst case channels than prior art designs. See, for example, V. Jayaraman et al., "Theory, Design, and Performance of Extended Tuning Range in Sampled Grating DBR Lasers," *IEEE J. Quantum Elec.*, v. 29, (no. 6), pp. 1824–1834, (June 1993), H. Ishii et al., "Quasicontinuous Wavelength Tuning in Super-Structure-Grating (SSG) DBR Lasers", *IEEE J. Quantum Elec.*, v. 32, (no. 3), pp. 433–441, (March 1996) and I. Avrutsky et al., "Design of Widely Tunable Semiconductor Lasers and the Concept of Binary Superimposed Gratings CBSG's)", *IEEE J. Quantum Elec.*, v. 34, (no. 4), pp. 729–741, (April 1998), all of which are incorporated by reference herein.

Figure 1A:
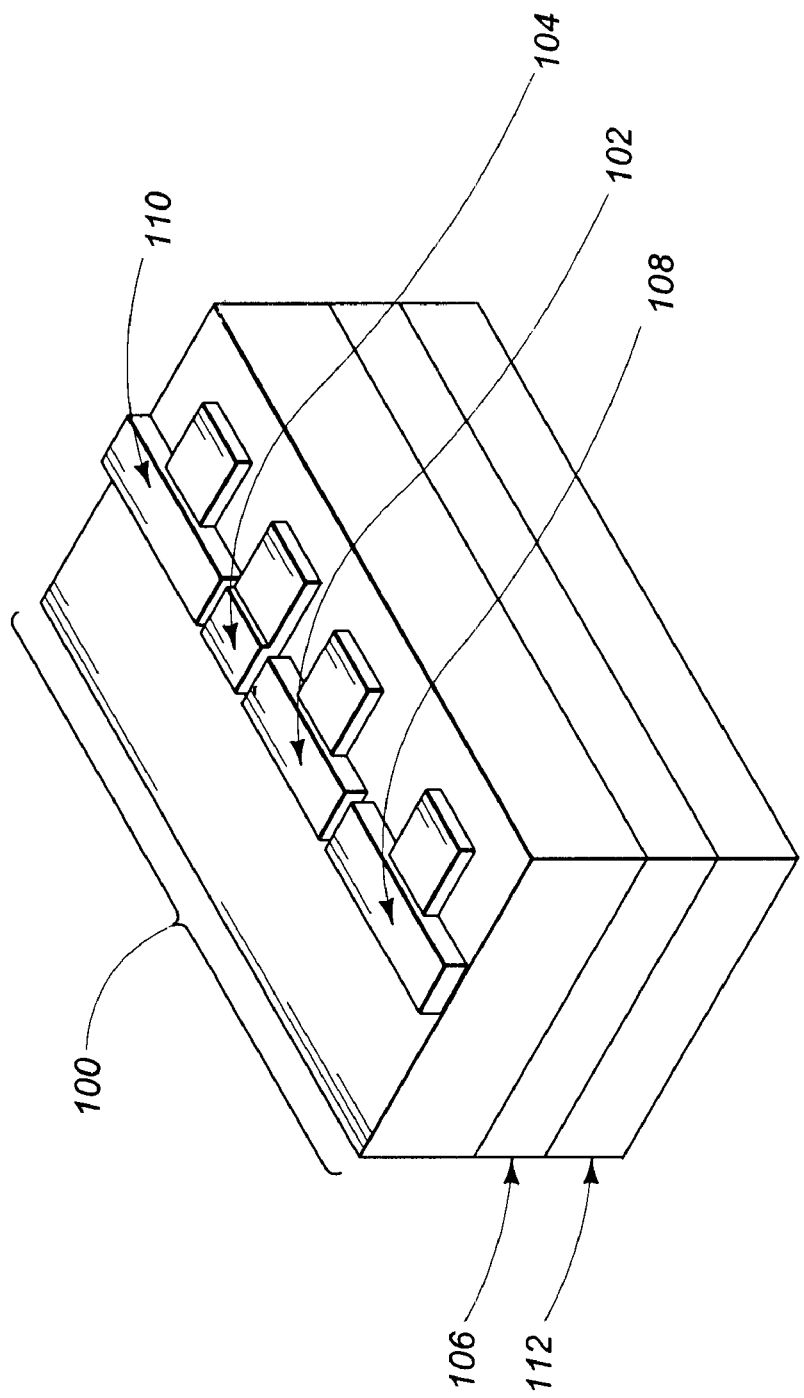
FIGS. 1A and 1B depict a SGDBR laser showing the four sections used to control the power and wavelength of the laser's emission.
Figure 1B:
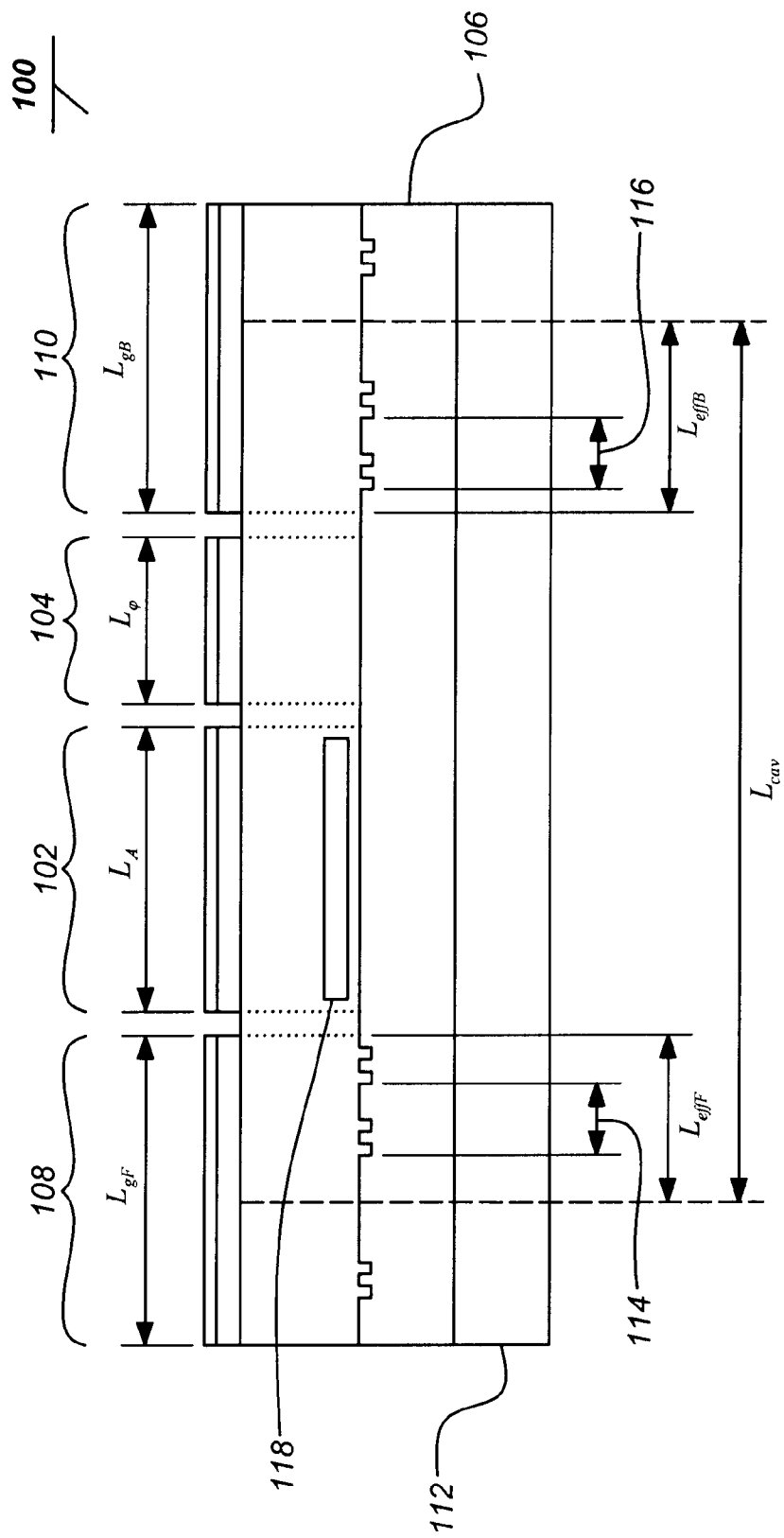

FIGS. 1A and 1B show a typical SGDBR laser illustrating the four sections that allow its unique tuning characteristics. The laser 100 is comprised of a gain section 102, a phase section 104, a front mirror 108 and a back mirror 110, wherein the sections have lengths $L_A$, $L_\varphi$, $L_{gF}$ and $L_{gB}$, respectively. Below these sections is a cavity 106 for guiding and reflecting the light beam, while the entire device is formed on a substrate 112. In use, generally bias voltages are connected to the top portions of the gain section 102 and a ground is connected to a lower substrate 112. When the bias voltage on the gain section 102 is above a lasing threshold, a laser output is produced from an active region 118.

The front and back mirrors 108, 110 are typically sampled grating mirrors that respectively include different sampling periods 114, 116. The gratings behave as wavelength-selective reflectors such that partial reflections are produced at periodic wavelength spacings of an optical signal carried in the cavity 106. The front and back sampled grating mirrors together determine the wavelength with the minimum cavity loss through their effective lengths $L_{effF}$ and $L_{effB}$ and grating differential, however, the lasing wavelength can only occur at the longitudinal modes of the optical cavity 106. Therefore, it is important to adjust the mirrors 108, 110 and cavity 106 mode to coincide, thereby achieving the lowest cavity 106 loss possible for the desired wavelength. The phase section 104 of the device shown in FIG. 1 is used to adjust the optical length $L_{cav}$ of the cavity 106 in order to position the cavity 106 modes. Alternatively, the front and back mirrors may be formed from another modulated grating such as superstructure gratings, or other modulated gratings known to those skilled in the art.

Figure 2:
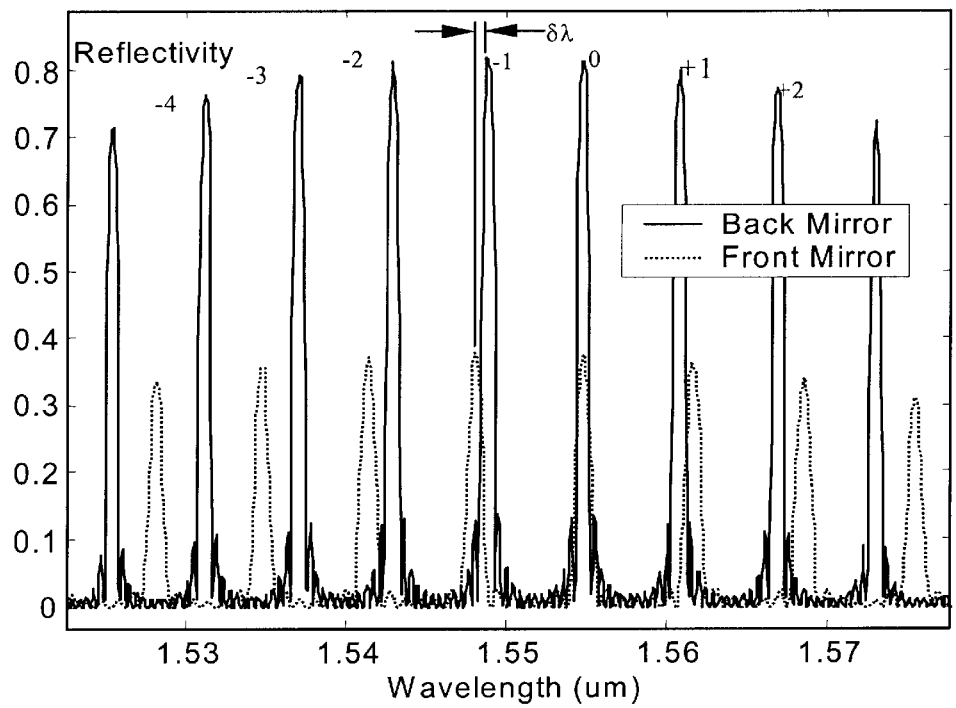
FIG. 2 is a plot of reflectivity versus wavelength of typical SGDRB laser mirrors.

FIG. 2 illustrates the reflectivity spectra common to many designs. The Vernier relationship between the reflectivity peaks of the front and back sampled grating mirrors is what gives the SGDBR laser its enhanced tunability over a conventional DBR laser. Any wavelength within the tuning range can be reached by selecting an appropriate front and back mirror peak, and tuning them along with the phase section to achieve lasing at the desired wavelength.

Figure 3:
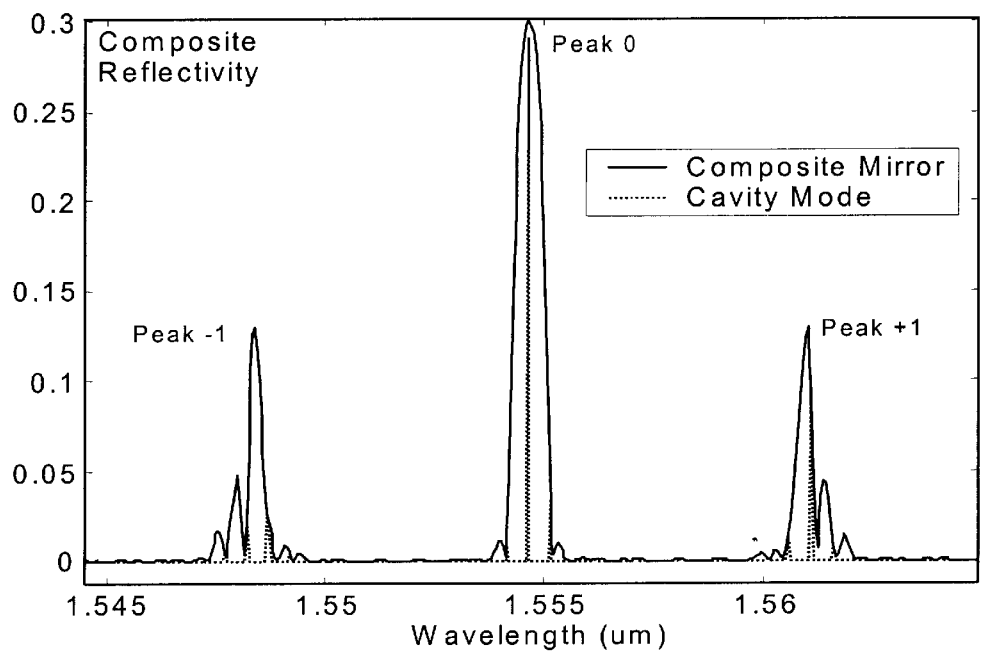
FIG. 3 depicts composite reflectivity of the front and back mirror overlaid on the cavity modes of the laser.

FIG. 3 illustrates an example of the reflectivity (i.e. cavity loss) experienced by the cavity modes under this condition. Composite reflectivity, the product of the front and back mirror reflectivities are overlaid on the cavity modes of the laser. The lasing wavelength is determined by the cavity mode with the highest reflectivity. The optimum stability is achieved when the cavity mode and the mirror are in perfect alignment.

The nature of the Vernier sampled grating mirrors creates a complicated design space for the optimization of tuning range, output power, and mode suppression. This invention relates to a design approach and specification to achieve given performance goals with the constraints of a sampled grating mirror design. Methods are also presented to eliminate some of the constraints of the sampled grating mirrors in ways that are simpler and more manufacturable than those illustrated in the prior art.

In general, the performance goals for devices intended for telecommunication applications are tuning ranges between 40–100 nm, fiber coupled output powers of several milliWatts up to the tens of milliWatts, and a side mode suppression ratio (SMSR) in excess of 30 dB. The tuning range of a given SGDBR design is limited by the available gain-bandwidth and the "repeat mode spacing" ($\lambda_R$) which is the span in wavelength between the points of perfect alignment between the front and back Vernier sampled grating mirror reflectivity peaks (i.e. two periodic functions will coincide with a period equal to the lowest common integer multiple of their periods). A very simple approximate formula can be given by:

$$\lambda_R = \frac{\Delta\lambda_b \Delta\lambda_f}{\delta\lambda} \quad (1)$$

where $\Delta\lambda_b$ and $\Delta\lambda_f$ are the separation between the back and front mirror peaks, respectively, and $\delta\lambda$ is $\Delta\lambda_f - \Delta\lambda_b$.

One of the common questions of the design is the amount of tuning enhancement, indicated generally by:

$$F < \sqrt{\frac{\Delta\lambda_b \Delta\lambda_f}{\delta\lambda}}$$

that should be used to cover a given tuning range (i.e. fewer peaks with larger tuning between them, or more peaks with less peak tuning required). The present invention is intended to identify the design space that yields devices with the highest output powers, for a given tuning range and side mode suppression and what tuning enhancement should be used to achieve this.

The design should focus on achieving output power, and then apply the limitation of SMSR and tuning range. Prior art designs of SGDBR lasers have made use of front and back mirrors with relatively equal reflectivity. With free range of the cavity parameters, those skilled in the art can easily apply optimization routines that result in highly asymmetric cavities to produce higher output powers.

Figure 4:
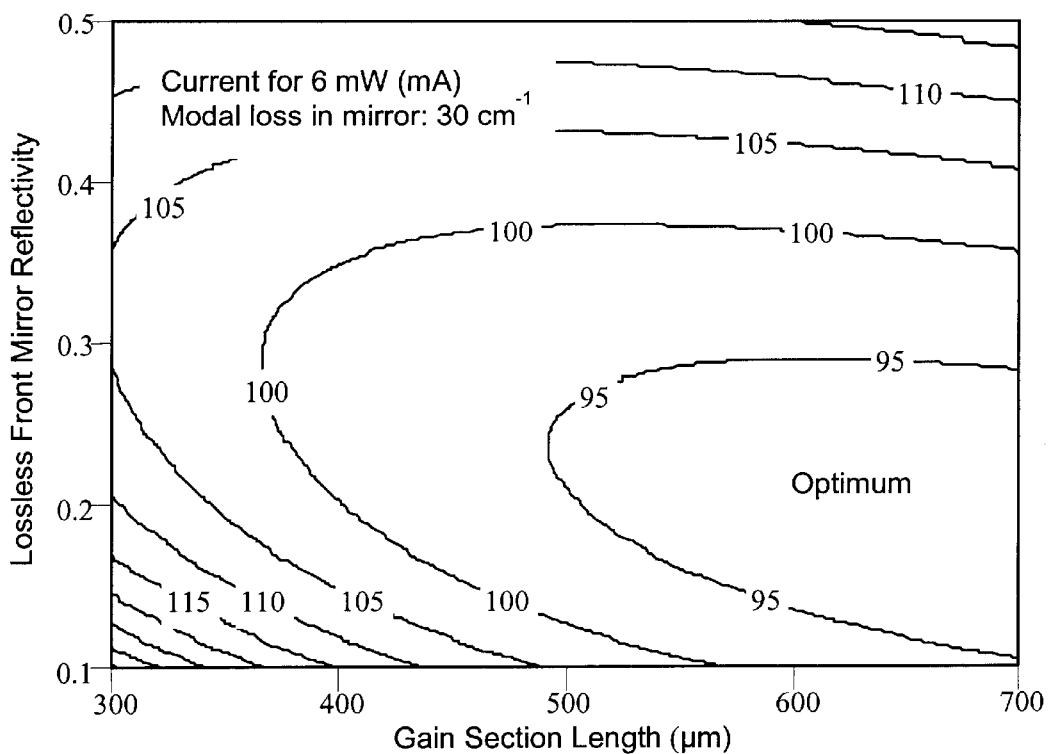
FIG. 4 is a contour plot illustrating the selection of the front mirror reflectivity and length of the gain section (Lg) for minimum current and a particular output power.

FIG. 4 illustrates an example of this kind of cavity optimization performed on a SGDBR laser. A contour plot illustrating the selection of the front mirror reflectivity and length of the gain section ($L_g$) for minimum current and a particular output power. The parameters are chosen using the worst-case loss and estimated mirror penetration depths (120–150 μm). The back mirror has a fixed reflectivity of 0.85. A given output power can be achieved with a minimum current by adjusting the front mirror reflectivity and length of the gain region for a fixed back mirror reflectivity and number of quantum wells. Indeed, experimentally the highest output power DBR lasers use anti-reflective (AR) coated facets (R~1%) as the front mirror with the back mirror DBR reflectivity (without loss) over 85%. To maintain SMSR in a DBR requires engineering only the cavity length and the back DBR to sufficiently suppress adjacent cavity modes. This engineering involves using a fairly high grating coupling constant of between about 40–50 cm$^{-1}$, short cavity lengths and a large number of quantum wells (10). Those skilled in the art will understand that the high kappa's have been chosen to make the reflectivity of the DBR less sensitive (i.e. low penetration depth) to the large changes in optical loss that occur in the mirror during tuning.

Figure 5:
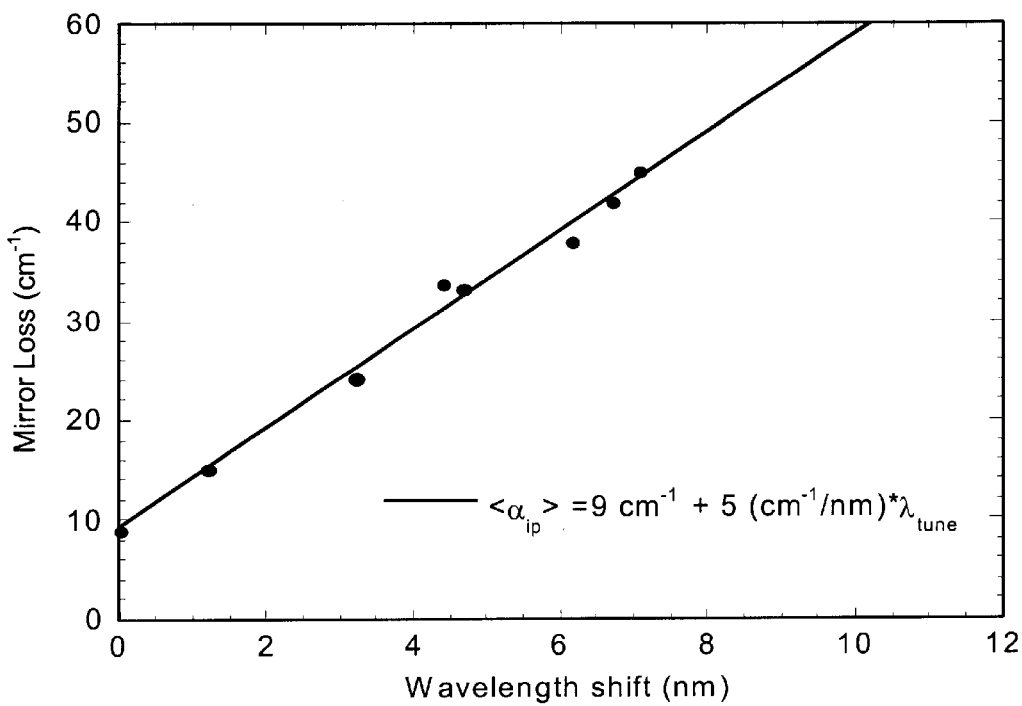
FIG. 5 illustrates modal propagation loss in the distributed Bragg reflector (DBR) under wavelength tuning.
Figure 6A:
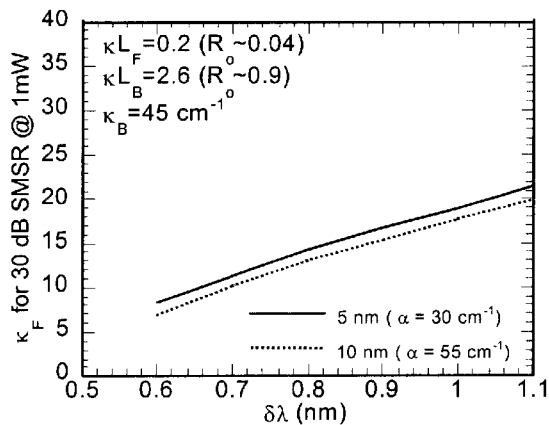
FIGS. 6A–6D illustrate the maximum allowed $\kappa$ for the front mirror to meet the side mode suppression ratio criteria.
Figure 6B:
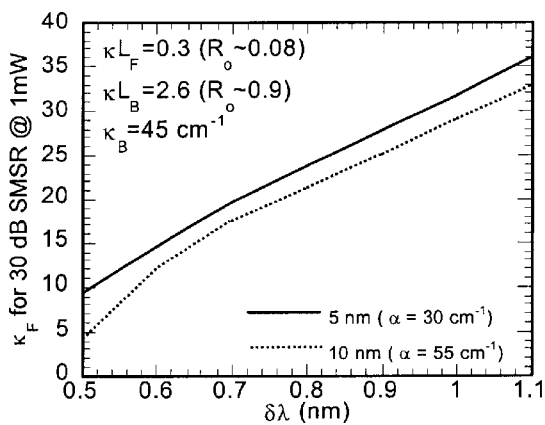
Figure 6C:
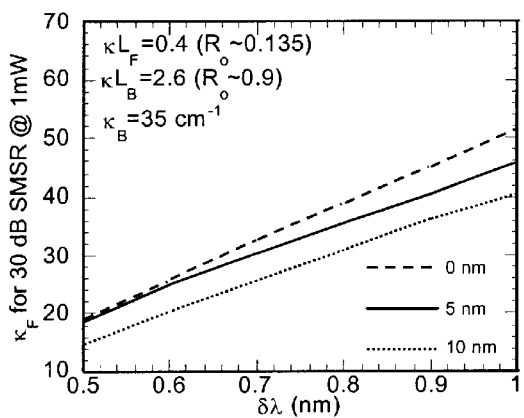
Figure 6D:
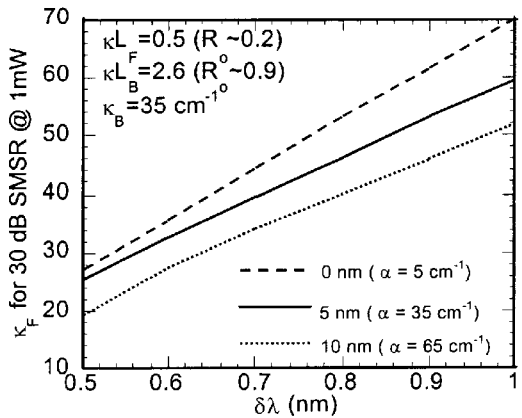

FIG. 5 illustrates modal propagation loss in the DBR under wavelength tuning, inherent due to the index change required to achieve tuning. One result of this high kappa (κ) is a large DBR reflection bandwidth (>1 nm), which then requires a short gain section length (<400 µm) to maintain a 30 dB SMSR (at 1 mW output power) over adjacent cavity modes. Providing the high output power in the presence of tuning losses with a short cavity length requires the high gain pet unit length (large number of quantum wells) in the active region.

Achieving these same results in SGDBR laser designs are complicated by the fact the front mirror plays a critical role in the mode suppression of the adjacent supermodes, which can be seen in FIG. 2. As the reflectivity of the front mirror is decreased, the reflection bandwidth obviously broadens, thus there exists a maximum available modal index change $\Delta n_{max}$. To maintain the required sidemode suppression, the front mirror effective κ (i.e. the grating κ times the sampling duty ratio) must be decreased and a smaller tuning enhancement, F, is required (i.e. δλ is inversely proportional to tuning enhancement).

FIGS. 6A–6D illustrate the largest κ allowed for a 30 dB SMSR (at 1 mW output power) for various front mirror reflectivities (i.e. κL) as a function of the tuning enhancement used. Larger κ front mirrors (and hence shorter lengths) are allowed for designs with higher front mirror reflectivity, lower tuning enhancement and smaller tuning ranges (i.e. less peak tuning).

Figure 7:
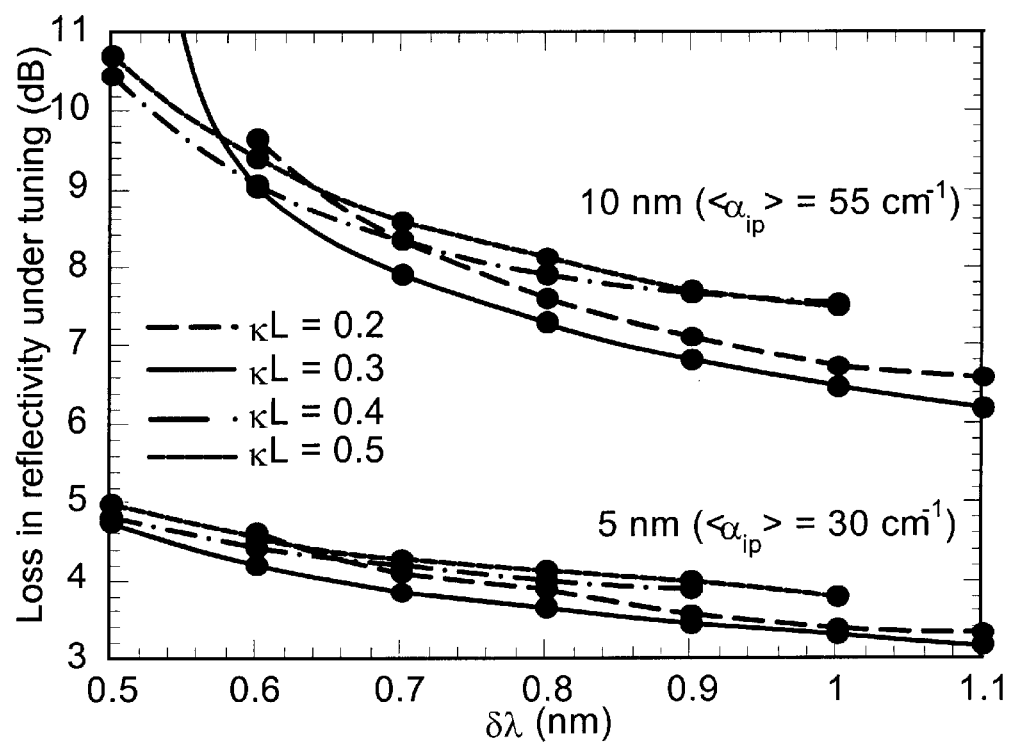
FIG. 7 is a plot showing the drop in cavity reflectivity ($R_f R_b$) under tuning as a function of tuning enhancement.

FIG. 7 illustrates the effect of tuning on the mirror reflectivity which shows the drop in the total reflectivity ($R_f$–$R_b$) as a function of the tuning enhancement for the mirror parameters described in FIG. 6. Larger δλ with correspondingly higher κ mirrors lead to less change in the mirror reflectivity within the cavity. The smaller tuning enhancements give less change in reflectivity for a given loss due to the shorter, higher κ front mirror that can be used. Additionally, the back mirrors with higher κ (45 cm$^{-1}$ for κL=0.2 and κL=0.3 versus 35 cm$^{-1}$ for κL=0.4 and κL=0.5) had less increase in loss due to the smaller penetration depths of these back mirrors.

While FIG. 7 shows that lower tuning enhancement designs gives less loss for a given amount of tuning, they also require more tuning to achieve the same total tuning range. So the question remains: to covet a given tuning range, is it better to use more peaks with less index tuning or fewer, wider spaced peaks with more tuning? If the κ's of the mirrors are chosen to be the maximum allowed by the SMSR criteria for a given tuning enhancement, then it is better to choose less tuning enhancement.

Figure 8:
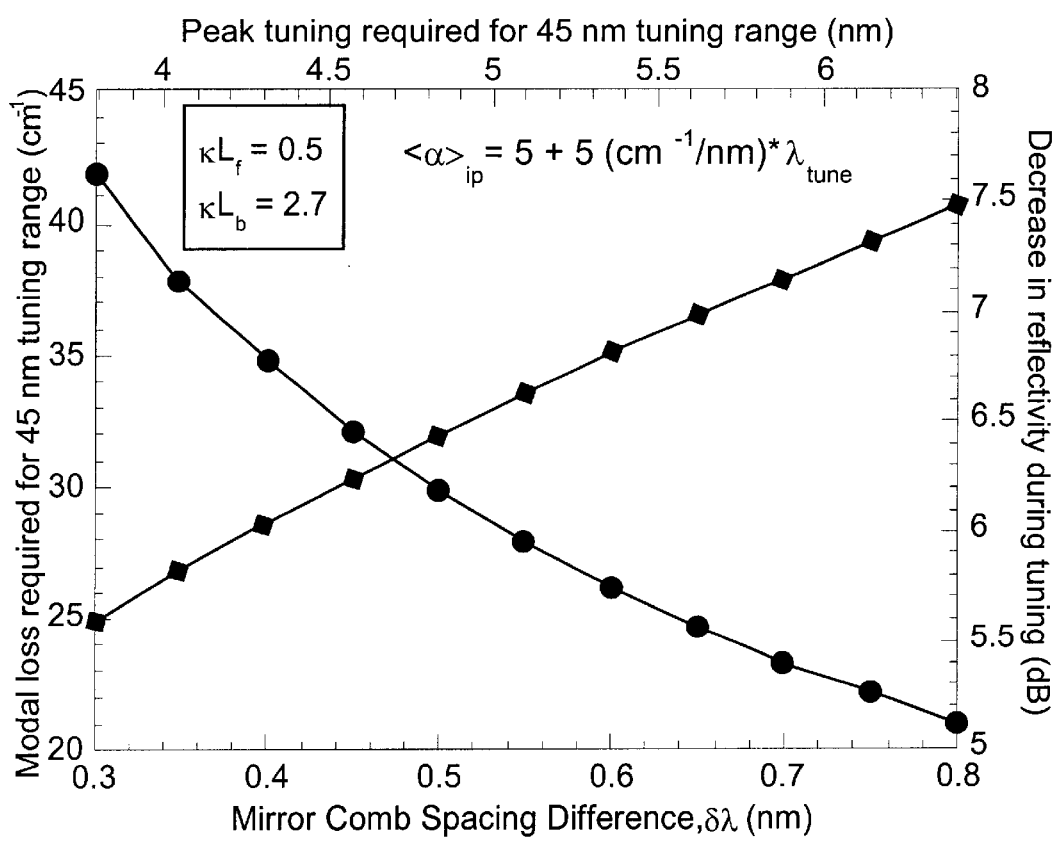
FIG. 8 illustrates that designs with higher tuning enhancement suffer greater loss of reflectivity during tuning.

FIG. 8 shows that despite the larger peak tuning (and hence propagation loss in the mirror) requited to achieve a 45 nm tuning range for the lower tuning enhancement designs, the total drop in reflectivity is actually less because the mirrors used in the lower tuning enhancement designs are shorter and have smaller penetration depths. While this may seem counter intuitive, the DBR laser described earlier gives an example of a limiting case. To achieve the highest output power when a tuning range of only 10–15 nm is required, one would most likely use a DBR laser (tuning enhancement of 1), where the front mirror has very small reflectivity (1%), the back mirror has a κ of 40–45 cm$^{-1}$. So, despite the lower tuning induced propagation loss required to achieve a given tuning range, designs with higher tuning enhancement suffer a greater loss of reflectivity during tuning due to the longer, lower κ mirrors required to meet SMSR criteria.

The conclusions that can be drawn from FIGS. 6–8 are that highly asymmetric designs for SGDBR lasers to yield high output powers can be best achieved with high κ mirrors (40–45 cm$^{-1}$ for the back mirror) and less tuning enhancement given a minimum SMSR criteria.

To summarize the design strategy for a particular tuning range and output power, the following criteria should be met. The back mirror should be chosen to have an effective κ close to the amount of propagation loss anticipated for the amount of peak tuning requited (5–10 nm, or 30–50 cm$^{-1}$). The maximum front mirror κ can be selected for a range of front mirror κL's (i.e. reflectivity) using the same anticipated loss and SMSR criteria. The maximum length of the gain section can be then be determined for each front mirror κL based upon the cavity mode spacing required to suppress the adjacent cavity modes within the mirror reflection bandwidth. (See FIG. 3.) With the back mirror parameters fixed, and length of the gain section limited, the various front mirror choices can be evaluated to see which yields the desired output power with the minimum current given the number of quantum wells within the design. Higher output powers of course favor lower reflectivity front mirrors, but will require increased gain to minimize the operating current. Those skilled in the can perform iterations from this basic starting point to quickly arrive at a design that achieves the desired output power with the minimum current with the highest cavity losses that will be experienced under tuning and meets the minimum SMSR criteria for all channels within the tuning range.

In order to enhance the device performance even beyond what can be achieved with the design methodology previously described, requires circumventing the tradeoffs that limit the performance. A fact that is consistently overlooked by the prior art is that the side modes can only exist at the modes of the cavity. Therefore, it is possible to use values of δλ that are smaller than that allowed by the SMSR criteria mentioned above, if the cavity mode and mirror reflections combs are designed properly. The proper design is to choose the mirror peak and cavity mode spacing such that when a cavity mode is positioned at the peak reflectivity, the cavity modes do not coincide with the highest reflectivity point of the adjacent peaks, thereby lowering the reflectivity experienced by the side modes. FIG. 3 illustrates an example of this. Clearly this design is easier to achieve by widening the spacing of the cavity modes. Toward this goal, the phase section should be made as short as possible while still adjusting the roundtrip phase by 2π and staying below the maximum allowed current density. The gain section length can be reduced by increasing the gain per unit length of the active region (e.g. more quantum wells). Additionally, the methodology presented above will result in the shortest penetration depth (i.e. mirror length) for the SGDBR mirrors, also resulting in wider cavity modes.

The following example is intended to illustrate several designs used to achieve the design goals. The main parameter that will be changed is δλ which is inversely proportional to the tuning enhancement factor, F. The design goals are as follows: a tuning range of 50 nm, an output power of 6 mW and SMSR at 1 mW of 33 dB.

Figure 9:
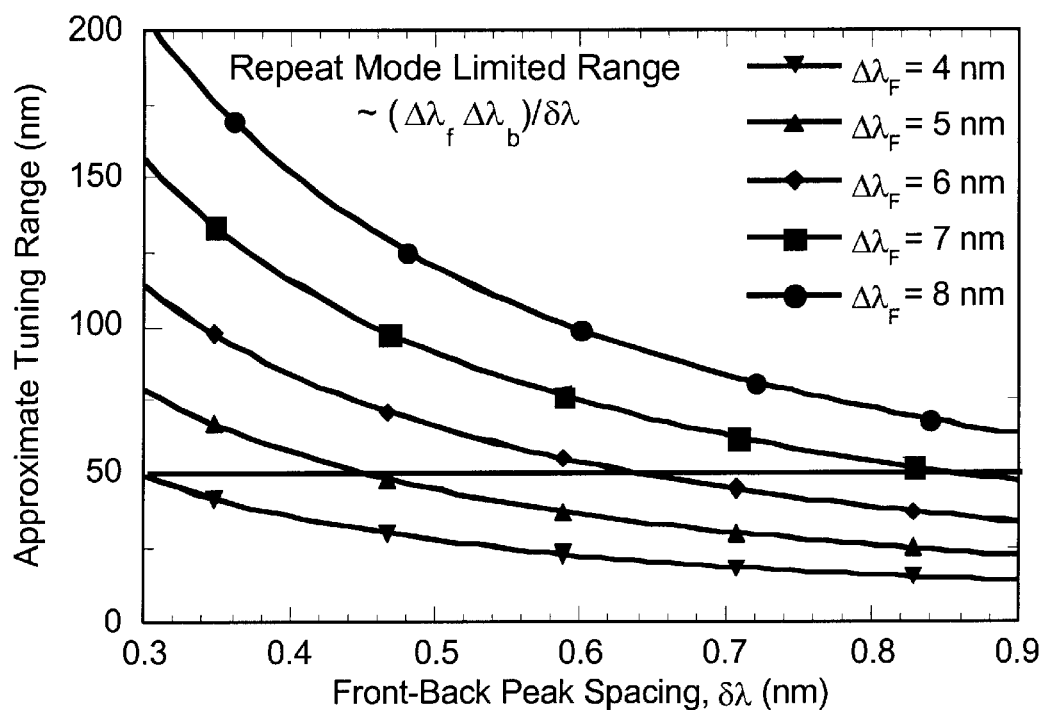
FIG. 9 shows the repeat mode limited tuning range for several front mirror peak spacings.

FIG. 9 shows the repeat mode limited tuning range for several front mirror peak spacings. The δλ's that will be investigated are 0.4 nm, 0.5 nm, 0.6 nm and 0.7 nm. These give peak tuning requirements of 4.8 nm to 6.2 nm to achieve the desired tuning range.

The back mirror is desired to have as a high a reflectivity as possible with a κL of around 2.5–3.0 which gives a reflectivity around 80–85%. The effective κ should be selected based upon the tuning range required for the design. To avoid excessive loss of reflectivity under tuning, κ should roughly equal α.

For the cases above, the losses will be around 30–35 cm$^{-1}$, so a κ of 33 cm$^{-1}$ is an optimum starting point. FIG. 5 shows the increase in passive modal waveguide loss under tuning.

The front mirror is more difficult to select, as both κ and L need to be chosen. Treat the laser as a Fabry-Perot laser with a free selection of the front mirror reflectivity and the length of the gain region. By minimizing the current required for the desired output power, one can find the reflectivity for the front mirror.

Cavity optimization equations for selecting the front mirror reflectivity are given as follows.

$$I = \left\{ \left[ \frac{J_V + \frac{I_p \cdot <\alpha>_{ia}}{N_w \cdot w \cdot d \cdot \ln(1/\sqrt{R_f R_b})}}{<g_{th}> - <\alpha>_{ia}} \right] \cdot N_w \cdot w \cdot d \cdot \ln\left(\frac{1}{\sqrt{R_f R_b}}\right) + I_p \right\} \quad (2)$$

$$\left( 1 + \frac{1 + <\alpha>_{ia} \cdot L_p}{\ln(1/\sqrt{R_f R_b})} \right)$$

where $$I_p = \frac{q}{h\nu} \frac{P_o}{\eta_i F}$$

$R_f = R_{fo} \cdot \exp(-2 \cdot <\alpha>_{ip} \cdot L_{pf})$
$R_b = R_{bo} \cdot \exp(-2 \cdot <\alpha>_{ip} \cdot L_{pb})$
$J_V$=Volume threshold current density
$N_w$=Number of Quantum Wells (QWs)
w=Device width
d=QW thickness
$<\alpha>_{ia}$=Active region modal internal loss
$<\alpha>_{ip}$=Passive region modal internal loss
F=Fraction of power exiting front mirror
$P_o$=Desired output power
$L_{pf}$=Front mirror penetration depth
$L_{pb}$=Back mirror penetration depth
$R_{fo}$=Lossless front mirror reflectivity
$R_{bo}$=Lossless back mirror reflectivity To apply equation (2) it is important to use the waveguide losses for the wavelength channels requiring the largest peak tuning (30–35 cm$^{-1}$). This is complicated by the fact that the penetration depth of the front mirror is unknown; a guessed value is used to obtain an estimate of the desired front mirror reflectivity. The front mirror reflectivity will be less than the back mirror, so its penetration depth will be about somewhere between 1 and 0.5 times that of the back mirror. Once a rough value of the desired reflectivity is determined, recalculate with a more accurate penetration depth.

For example, once it is determined that a lossless front mirror reflectivity around 0.2–0.25 ($\kappa L_f$~0.5) is desired (as in FIG. 4), the effective κ for the front mirror is selected. This is chosen based upon the SMSR criteria and the δλ chosen for the design. A rule of thumb is that the half width at half maximum (HWHM) of the front mirror (including loss) should be roughly equal the δλ/2 (i.e. the ratio of the peak sidemode reflectivity to the desired peak reflectivity should be 0.75–0.8 for 30 dB SMSR at 1 mW and approximately 80%/20% mirrors).

Figure 10:
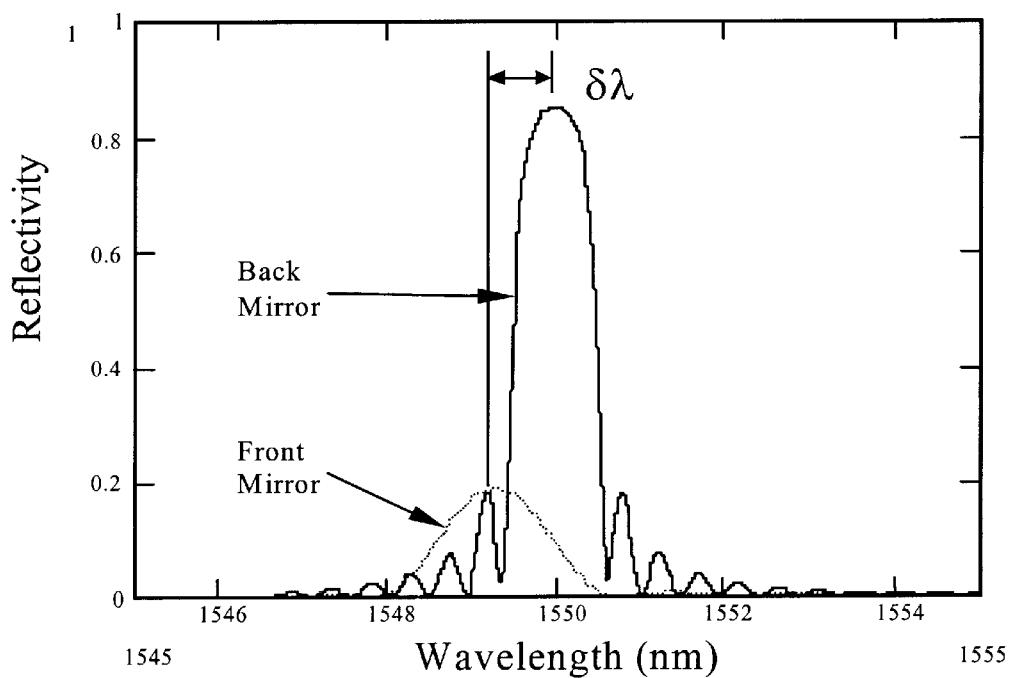
FIG. 10 is a schematic illustrating the relationship between the side mode suppression ratio of the supermode adjacent to the desired lasing wavelength.

FIG. 10 is a schematic illustrating the relationship between the SMSR of the supermode adjacent to the desired lasing wavelength and the front and back mirror reflectivity curves. FIG. 10 also uses a more rigorous equation relating the front and back mirror to properties to the SMSR. The relation is as follows.

$$SMSR \geq \left[ M + \frac{<\Delta g>_{th}}{<g>_{th}} \right] \cdot 10^4 \cdot (mW)^{-1} \cdot P_o(mW) \quad (3)$$

$$M_{ch} = \frac{\ln[R_b R_f(\lambda_1)/R_b R_f(\lambda_o)]}{\ln[R_b R_f(\lambda_o)]}$$

This equation can be applied to select the effective κ of the front mirror now that its approximate κL is known.

FIG. 11 is a table of calculated examples. Using this design example shows that the performance of the worst channel is best for the shortest front mirror. This is a result of the loss dominating the design space. Front mirrors with shorter penetration depths are less affected by the large losses experienced under tuning. Shortening the front mirror increases its reflection bandwidth, thereby requiring larger δλ (and hence more tuning) to maintain the SMSR and tuning range requirements. It is interesting to note that despite the extra tuning required, the cavity losses of the worst case channel are lower for designs with shorter mirrors. This fact is unrecognized in the prior art, which mainly addresses the increase in loss by setting κ~α for the mirrors. This is valid for the higher reflectivity mirrors (>0.5) used in the prior art, but the penetration depth is dominated by the length of the mirror for the low reflectivities (<0.3) needed for more output power.

Figure 12:
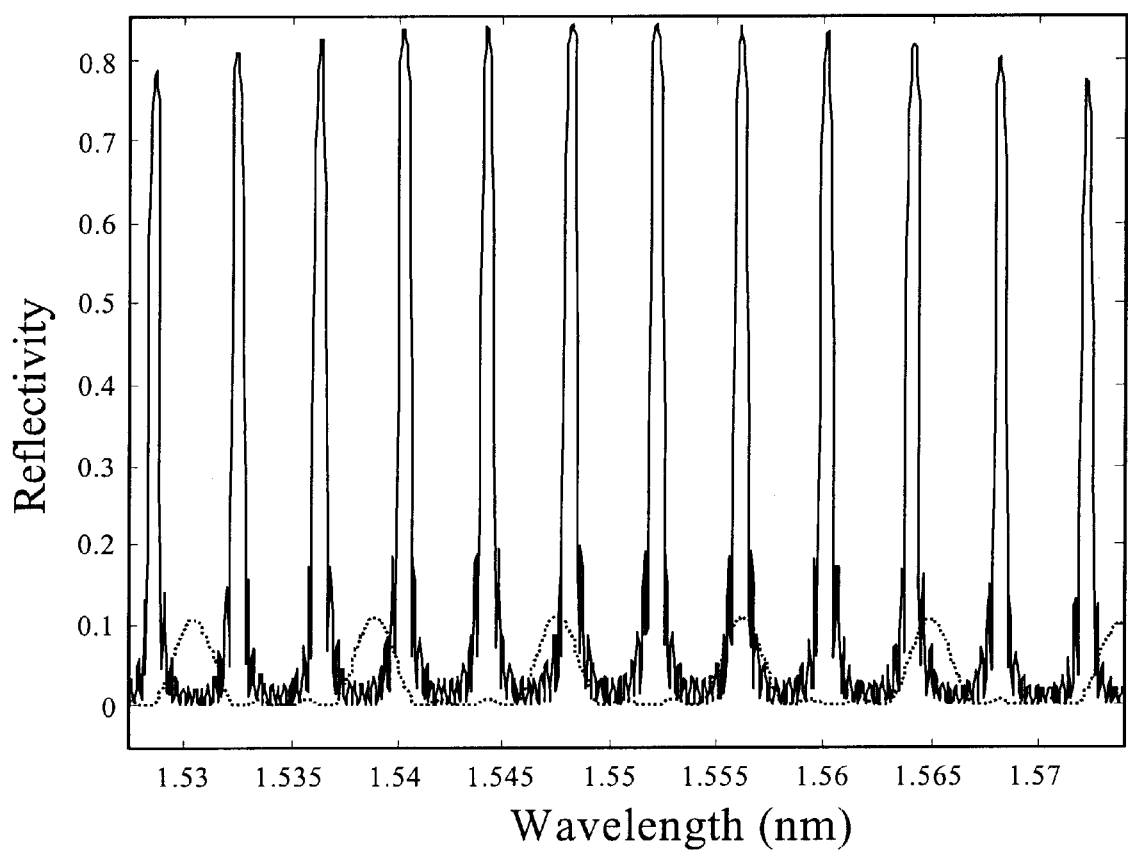
FIG. 12 illustrates using two back mirror peaks for every front mirror in order to have longer gain section length without side mode suppression ratio (SMSR) problems due to adjacent cavity modes.

As higher output powers are desired, the reflectivity of the front mirror is required to be even lower (0.1–0.05). The larger bandwidths of these mirrors will require even larger δλ (1–1.2 nm) with mirror lengths below 125 μm. At this point the SMSR is determined not only the by the cavity modes at adjacent supermodes, but also but the cavity modes within the reflection bandwidth of the main reflectivity peak. This is a result of the sum of the mirror penetration depth becoming less than 20–30% of the total cavity length that is required to achieve the desired filtering. Shortening the gain section length accordingly leads to excessive threshold current densities (>4 kA/cm$^2$). A novel solution to this problem is to use twice as many back peaks as front peaks to cover a given tuning range. FIG. 12 illustrates using two back mirror peaks for every front mirror in order to have longer gain section length without SMSR problems due to adjacent cavity modes. For example use twelve, 3.8 nm spaced back mirror peaks and six, 8.2 nm spaced front mirror peaks, in which the repeat mode spacing is roughly $[(\Delta\lambda_b \cdot \Delta\lambda_f)/(\Delta\lambda_f - 2 \cdot \Delta\lambda_b)]$ to cover a 50 mn range. The advantage of this arrangement is that the penetration depth of the back mirror can be twice as long (thereby allowing only one cavity within its the stopband for longer gain section lengths, 500–600 μm) and still have κ~α, as not to suffer excessive loss under tuning (α being smaller due to the smaller peak tuning required). The narrower back mirror allows for smaller δλ's to be used given the same front mirror, making up for the fact the repeat mode spacing is two times smaller.

Figure 13:
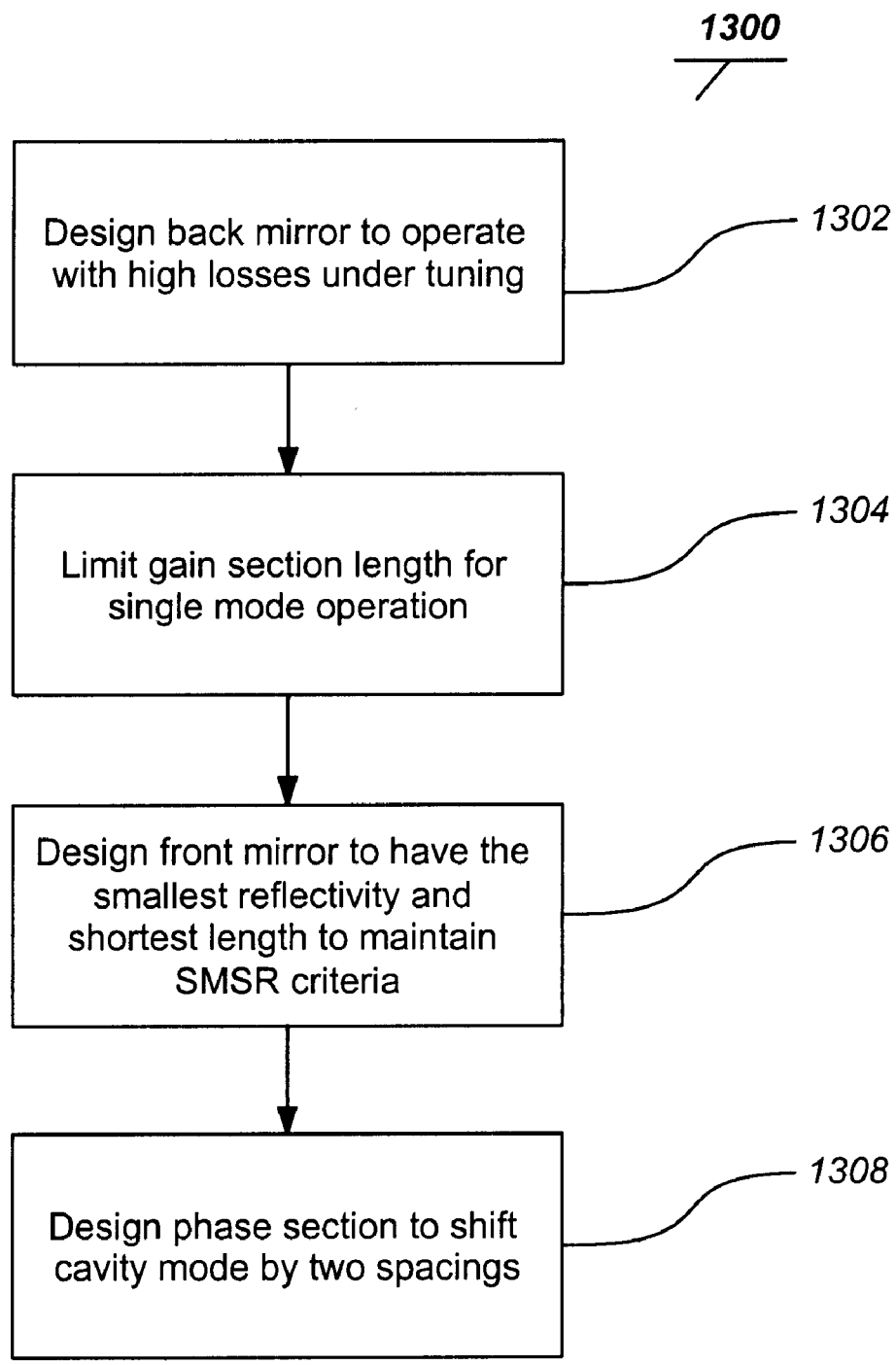
FIG. 13 is a flowchart that illustrates the design process according to the preferred embodiment of the present invention

FIG. 13 is a flowchart that illustrates the design process 1300 according to the preferred embodiment of the present invention. Given $\Delta n_{max}$, $P_{out}$, $\Delta\lambda_{max}$, MSR as design parameters, assuming HR/AR design for highly efficient output and using $\alpha_{bmax}$ from $\Delta n_{max}$, $\kappa = \alpha_{bmax}$, the design process is detailed as follows:

Back Mirror: The back mirror should designed to specifications such that it can operate with the high losses that exist under tuning (Block 1302). To achieve this $\kappa_{effB}$~$\alpha_{Tune}$. Increase reflectivity, $R_b$, by increasing length until peak curvature begins to flatten. Flattening gives less adjacent mode suppression; $2<\kappa_{effB}L_{gB}<2.8$ and $R_b=\tanh\kappa_{effB}L_{gB}$. The length should be made to give sufficiently high reflectivity of about greater than 70%–80% without being excessively long, so preferably $\kappa_{effB}L_{gB} \sim 2.0$–$3.0$.

Gain Section: The length of the gain section is limited by the need for single mode operation (Block 1304). Use maximum total effective cavity length $L_{tot}$ for minimum $<\alpha_1>$ and $J_{th}$ and $R_{sp}'$. Max $L_{tot}$ is determined by minimum mode spacing for desired SMSR, given the curvature and reflection level of the back mirror peak and the reflection level, $R_f$, of the front mirror, assume preferably $\sim 0.2$. $\Delta\lambda_{mode} = \lambda^2/(2nL_{tot})$; $L_{tot} \leq KL_{effb}$, where K is approximately about 6 and $L_{effB}$) is and $L_{effb}$ is the penetration depth of the rear mirror.

Front Mirror: The front mirror design has the most constraints. However, it is desired to have the smallest reflectivity and shortest length that can maintain the SMSR criteria (Block 1306). To cover the desired tuning range, $\Delta\lambda_{Total}$; $\delta\lambda$, which represents the difference in mirror peak reflectivity spacing, must be chosen given the peak tuning that can be achieved, as shown in FIG. 9. Once $\delta\lambda$ is chosen, the bandwidth, i.e., full width at half maximum (FWHM), of the front mirror must be chosen to give the desired SMSR. A conservative criteria is the FHWM is twice the $\delta\lambda$. To achieve 30 dB SMSR (see FIG. 10) the front mirror must roll off to around 70–80% of its peak value at the point of maximum back mirror reflectivity at the adjacent supermode. Clearly, higher output powers require lower reflectivity (therefore wider bandwidth) front mirrors and hence wider peak tuning is required to achieve $\Delta\lambda_{Total}$, as the $\delta\lambda$ must be increased accordingly with the mirror bandwidth.

The magnitude of the front mirror reflectivity, $R_f$ is calculated from a minimization of gain current, I, for a calculated maximum total cavity length, $L_{tot}$ and power out, $P_o$. The length is given by $R_f = \kappa L_{gf}$. Generally, $|R_f|$ is approximately less than about 25% for substantially reasonable powers out.

As provided for hereinabove, the differential supermode spacing, $\delta\lambda$, and enhancement factor, F, are calculated from the total desired tuning range, $\Delta\lambda_{total}$, and available index shift, $\Delta n_{max}$. Assume $F = \Delta\lambda_{super}/\delta\lambda$; $\Delta\lambda_{super} = \lambda\Delta n_{max}/n$; $\Delta\lambda_{total} = F\lambda\Delta n_{max}/n$. Therefore, $\delta\lambda \sim (\Delta n_{max}\lambda/n)^2/\Delta\lambda_{total}$. Since the front mirror length is twice its penetration depth for small $R_f$, $L_{gf} \sim \lambda^2/(2\delta\lambda.n) = \Delta\lambda_{total}/2(\Delta n_{max})^2$.

Phase Section: The phase section is required to shift the cavity modes by two mode spacings under the mirrors (Block 1308). The length should also be such that the current density is below about substantially 5 kA/cm².

This concludes the description of the preferred embodiment of the present invention. In summary, the present invention discloses a method making a tunable laser, comprising designing a back mirror to operate with high losses under tuning, said back mirror bounding an end a cavity for guiding and reflecting a light beam, designing a gain section having a length limited for single mode operation, said gain section creating the light beam by spontaneous emission over a bandwidth, designing a front mirror having the smallest reflectivity and shortest length that can maintain a SMSR criteria for the laser, said front mirror bounding an opposite end of the cavity and designing a phase section capable of shifting cavity modes by two mode spacings, said phase section controlling the light beam around a center frequency of the bandwidth.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A tunable laser comprising:
   a gain section for creating a light beam by spontaneous and stimulated emission over a bandwidth;
   a phase section for controlling the light beam around a center frequency of the bandwidth and disposed proximate to the gain section;
   a cavity for guiding and reflecting the light beam wherein the gain section and the phase section are within the cavity;
   a front minor bounding an end of the cavity and having a smallest reflectivity and a shortest length that can maintain a side mode suppression ratio (SMSR) criteria; and
   a back mirror bounding an opposite end of the cavity;
   wherein the back mirror has a $\kappa_{effB}$ approximately equal to $\alpha_{Tune}$, where $\kappa_{effB}$ is an effective coupling constant and $\alpha_{Tune}$ is an amount of propagation loss anticipated for an amount of peak tuning required, and a length of the back mirror is made to produce greater than approximately 70% reflectivity.

2. The tunable laser of claim 1, wherein a length of the gain section is chosen to minimize a composite reflectivity for all undesired cavity modes.

3. The tunable laser of claim 1, wherein the phase section is capable of shifting cavity modes of the laser by at least two mode spacings.

4. The tunable laser of claim 1, wherein $\kappa_{effB} \times L_{gB}$ is approximately 2.0 to 3.0.

5. The tunable laser of claim 1, wherein a length of the gain section is no more than approximately five times a penetration depth of the back mirror.

6. The tunable laser of claim 1, wherein a length of the phase section is such that a current density of less than 5 kA/cm² is required to produce a cavity mode shift of two mode spacings.

7. The tunable laser of claim 1, wherein the front mirror has a front-back peak spacing based upon a tuning range of the laser and a bandwidth based on a side mode suppression ratio criteria.

8. The tunable laser of claim 1, wherein the front mirror has a bandwidth approximately two times a front-back peak spacing.

9. The tunable laser of claim 1, wherein the length of the back mirror is made to produce greater than approximately 80% reflectivity.

10. The tunable laser of claim 1, wherein the front mirror is intended to produce less than approximately 25% reflectivity.

11. The tunable laser of claim 1, wherein the front mirror has a length less than or substantially equal to the length of the back mirror.

12. A method of producing a tunable laser, comprising:
    providing a back mirror to operate with high losses under timing, said back mirror bounding an end of a cavity for guiding and reflecting a light beam and having a length to produce greater than approximately 70% reflectivity;
    providing a gain section disposed within the cavity and having a length limited for single mode operation, said gain section creating the light beam by spontaneous and stimulated emission over a bandwidth within the cavity;

providing a front mirror having a smallest reflectivity and shortest length that can maintain a side mode suppression ratio (SMSR) criteria for the laser, said front minor bounding an opposite end of the cavity for guiding and reflecting the light beam; and providing a phase section disposed proximate to the gain section and within the cavity for shifting cavity modes by two mode spacings, said phase section controlling the light beam around a center frequency of the bandwidth within the cavity.

13. The method of claim 12, wherein the back mirror has a $\kappa_{effB}$ approximately equal to $\alpha_{Tune}$, where $\kappa_{effB}$ is an effective coupling constant and $\alpha_{Tune}$ is an amount of propagation loss anticipated for an amount of peak tuning required.

14. The method of claim 12, wherein a length of the back mirror is made to produce greater than approximately 80% reflectivity.

15. The method of claim 12, wherein $\kappa_{effB} \times L_{gB}$ is approximately 2.5 to 3.0.

16. The method of claim 12, wherein the length of the gain section is chosen to limit the number of cavity modes within a stop band of the back mirror.

17. The method of claim 12, wherein the length of the gain section is no more than approximately five times a penetration depth of the back mirror.

18. The method of claim 12, wherein the phase section is designed having a length such that a current density equal to or less than 5 kA/cm² shifts the cavity modes by two mode spacings.

19. The method of claim 12, wherein the front mirror has a front-back reflection peak spacing based upon a tuning range of the laser and a bandwidth based on a side mode suppression ratio criteria.

20. The method of claim 12, wherein the front mirror has a bandwidth approximately two times a front-back peak spacing.

21. The method of claim 12, wherein the front mirror is formed to have a reflectivity of less than or equal to 25%.

22. A tunable laser, comprising:

a back mirror operating with high losses under tuning, said back mirror bounding an end of a cavity for guiding and reflecting a light beam and having a length to produce greater than approximately 70% reflectivity;

a gain section disposed within the cavity and having a length limited for single mode operation, said gain section creating the light beam by spontaneous stimulated emission over a bandwidth;

a front mirror having a smallest reflectivity and shortest length that can maintain a side made suppression ratio (SMSR) criteria for the laser, said front mirror bounding an opposite end of the cavity; and a phase section disposed proximate to the gain section and within the cavity for shifting cavity modes by two mode spacings, said phase section controlling the light beam around a center frequency of the bandwidth.

23. The tunable laser of claim 22, wherein the back mirror has a $\kappa_{effB}$ approximately equal to $\alpha_{Tune}$, where $\kappa_{effB}$ is an effective coupling constant and $\alpha_{Tune}$ is a maximum of an amount of propagation loss anticipated for an amount of peak tuning required.

24. The tunable laser of claim 22, wherein the length of the back mirror is made to produce greater than approximately 80% reflectivity.

25. The tunable laser of claim 22, wherein $\kappa_{effB} \times L_{gB}$ is approximately 2.5 to 3.0.

26. The tunable laser of claim 22, wherein the length of the gain section is chosen to suppress cavity modes within a stop band of the back mirror.

27. The tunable laser of claim 22, wherein a cavity length of the gain section is no more than approximately five times a penetration depth of the back mirror.

28. The tunable laser of claim 22, wherein the phase section has a length such that its current density is below 5 kA/cm² for necessary adjustment of the cavity mode wavelength.

29. The tunable laser of claim 22, wherein the front mirror has a front-back mirror reflecting peak spacing based upon a tuning range of the laser and a bandwidth based on a side mode suppression ratio criteria.

30. The tunable laser of claim 22, wherein the front mirror has a bandwidth approximately two times a front-back mirror reflectivity peak spacing.

31. The tunable laser of claim 1, wherein the front mirror length is less than ⅔ the back mirror length.

32. The method of claim 12, wherein the front mirror length is less than ⅔ the back mirror length.

33. The tunable laser of claim 22, wherein the front mirror length is less than ⅔ the back mirror length.

* * * * *

UNITED STATES PATENT AND TRADEMARK OFFICE
CERTIFICATE OF CORRECTION

PATENT NO.    : 6,590,924 B2
DATED         : July 8, 2003
INVENTOR(S)   : Gregory A. Fish and Larry A. Coldren It is certified that error appears in the above-identified patent and that said Letters Patent is hereby corrected as shown below:

Column 12,
Line 4, "made" should read -- mode --

Signed and Sealed this

Twenty-fifth Day of November, 2003

JAMES E. ROGAN
*Director of the United States Patent and Trademark Office*